(12) United States Patent
Block et al.

(10) Patent No.: US 7,848,727 B2
(45) Date of Patent: Dec. 7, 2010

(54) INTEGRATED RADIO FREQUENCY MODULE

(75) Inventors: Christian Block, Stainz (AT); Miguel Falagan, St. Martin/Sulmtal (AT); Isabel Gavela, Graz (AT); Holger Fluhr, Graz (AT)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 11/175,961

(22) Filed: Jul. 6, 2005

(65) Prior Publication Data

US 2006/0058000 A1   Mar. 16, 2006

(30) Foreign Application Priority Data

Jul. 7, 2004   (DE) .................. 10 2004 032 928

(51) Int. Cl.
*H04B 1/10*   (2006.01)
(52) U.S. Cl. .................. 455/313; 455/311; 455/333; 455/334; 455/553.1; 333/204; 333/205; 257/700
(58) Field of Classification Search ............... 455/333, 455/311, 313, 334, 553.1, 125, 129, 269; 257/700; 343/853; 333/175–176, 204–205, 333/211, 218
See application file for complete search history.

(56) References Cited

U.S. PATENT DOCUMENTS

| 5,707,486 | A | * | 1/1998 | Collins | .................. | 156/345.49 |
| 2002/0011907 | A1 | | 1/2002 | Yamada et al. | | |
| 2002/0039667 | A1 | * | 4/2002 | Takaya et al. | ............... | 428/692 |
| 2004/0046618 | A1 | * | 3/2004 | Sheen et al. | .................. | 333/26 |
| 2004/0075435 | A1 | * | 4/2004 | Weyers et al. | ............... | 324/318 |
| 2004/0185816 | A1 | * | 9/2004 | Ji | ............................... | 455/313 |
| 2005/0151240 | A1 | * | 7/2005 | Takeda et al. | ............... | 257/700 |
| 2006/0025102 | A1 | * | 2/2006 | Kipnis et al. | ................ | 455/333 |

FOREIGN PATENT DOCUMENTS

DE   10228328   1/2004

* cited by examiner

*Primary Examiner*—Wayne Cai
(74) *Attorney, Agent, or Firm*—Fish & Richardson P.C.

(57) ABSTRACT

A radio frequency (RF) module includes a multilayer substrate having dielectric layers and metallization layers that include one or more circuit elements. The metallization layers are located between the dielectric layers. The RF module also includes a symmetric transmission input associated with the multilayer substrate, an RF element on the multilayer substrate to provide RF functionality, and a balun integrated in the substrate behind the symmetric transmission input.

20 Claims, 2 Drawing Sheets

INTEGRATED RADIO FREQUENCY MODULE

CLAIM OF PRIORITY

The subject application claims priority to German Application No. 102004032928.1 (attached), which was filed on Jul. 7, 2004. The contents of German Application No. 102004032928.1 are hereby incorporated by reference into this application as if set forth herein in full.

BACKGROUND

Radio frequency (RF) modules that are used for mobile radio applications are constructed on multilayer substrates with interconnections integrated therein. A conventional transmission module may include a transmission amplifier (power amplifier), which is disposed at the top of the substrate module as a naked chip (bare die) or as a housed element. The module can include a matching network for transforming the output impedance of the power amplifier to the input impedance (usually 50 ohms) of the next element in the vicinity of the circuit.

A further level of integration includes so-called power switch modules PSM (also called TX modules), in which, in addition to the output matching network, TX filters and transmission/reception switches are provided. These are located as discrete elements on a top side of the module substrate.

The highest level of integration is represented by so-called TX modules with integrated reception filtering (also called power switch modules with integrated filtering, PSMiF). In such modules, reception filters are integrated as discrete elements on the top side of the module substrate and are connected with, or integrated in, the module.

An Rx signal path and an Rx output, at least one Tx signal path, at least one Tx input, and an antenna connector, along with to any number of other RF components and associated ICs, can be located on, or integrated in, a dielectric substrate of the RF module.

There are, however, requirements on the part of chip and telephone manufacturers to implement an RX path for future Universal Mobile Telecommunications System (UMTS) systems in a balanced manner starting with the duplexer. Such a symmetrical output requires two connectors, at which two signals of same magnitude but of opposite polarity, i.e., ideally with a 180° phases shift, can be obtained. Such balanced outputs are particularly simple to be supplied to modern RX signal amplifiers. The terminals used for Global System for Mobile Communications (GSM) also require a symmetrical Rx signal.

A balanced output signal cannot be provided directly by a microwave ceramic filter or duplexer and therefore requires an external balun. Other filter techniques, such as FBAR filters and duplexers or SAW filters and duplexers can maintain the balun functionality in the integrated filter structure. External baluns are configured as discrete elements and are, for example, located on the RF module or the front-end module.

SUMMARY

In one embodiment of the invention, an RF module for a wireless communication system is constructed on a multilayer substrate. The multilayer substrate includes several dielectric layers in between which there are metallization layers where circuit elements are formed via structuring. At least one symmetrical Tx input, one Tx signal path, one Tx output and at least one additional RF functionality are located on or in the substrate. This RF functionality can also be integrated in the substrate. A balun is integrated in the substrate behind the symmetrical Tx input. The Tx output can also be an antenna connector. The balun is located in the Tx signal path in front of the amplifier. This allows for an amplifier, which operates asymmetrically despite the symmetrical Tx input.

With the balun integrated into the substrate, it is possible to forgo the previously known balun configured as a discrete element. This saves space on the module surface or on the surface of the PCB, on which known discrete baluns could also be located. The integration density is thus increased and costs are also reduced such that an RF module can be configured more economically than known RF modules.

In one embodiment of the invention, the RF module serves as a power switch module (PSM). Aside from the Tx path, this PSM can independently also include one or more components selected from among an antenna switch, reception filters (Rx filter) as well as Tx filters, amplifiers, an IC, matching networks, switches, LPFs (low pass filters) or DC lines.

The substrate can be a multilayer, low distortion or distortion-free ceramic with metallization layers located between the layers. The substrate can be an LTCC (Low Temperature Cofired) ceramic or an HTCC (High Temperature Cofired) ceramic. It is, however, also possible to configure the substrate as a laminate, for example as an FR4 printed circuit board.

The balun that is integrated into the substrate can be made of coupled $\lambda/4$ transformation lines, of LC (inductor-capacitor) members or of coupling lines, which are shortened with respect to the $\lambda/4$ transformation lines.

In a further integration stage, an RF module includes a power amplifier for the Tx signal path, which may be configured as a chip element and may be located on the substrate.

The RF module can contain a low-pass filter, e.g., acting as a transmission filter (Tx filter), which includes LC components, which are integrated in the module substrate in the form of the corresponding structured metallization layers. Low-pass filters can also include distributed elements or strip line resonators, or they can have a mixed structure that includes LC components and distributed elements.

Tx filters or interstage filters are, however, not always necessary.

The top of the module substrate can contain switches, which can be mounted as discrete semiconductor elements via flip chip technology or which are glued on and electrically contacted via conventional wire bond technology. The switches serve the purpose of selecting among different frequency bands or switching transmission and reception operation, with the antenna being alternatively connected by the switches to the transmission and respectively the reception path of the transmission module. These switches can be configured as current controlled elements, for example PIN diodes or as voltage controlled gallium arsenide switches. It is also possible to use CMOS switches, MEMS switches or switches from other circuit technologies.

The RF module can contain an additional reception filter (Rx filter) besides the transmission filter, which is located on the surface of the module substrate along with the switch. The interior of the module substrate can also contain adaptive circuits, such as a chip element configured as a power amplifier located on the substrate of the RF module. This element is specifically matched to the switches. Such an adaptive circuit, for example, provides for impedance matching of the power amplifier output to the 50 $\Omega$ at the input of the antenna switch.

The reception filter can be configured as a discrete element, for example as a SAW (Surface Acoustic Wave) filter, as a BAW (Bulk Acoustic Wave) filter or as a ceramic filter. In a further embodiment of this invention, the Rx filter can also be integrated in a module substrate that includes ceramic or other dielectric layers by being configured as an LC filter in the form of integrated inductances and capacitances or by means of electromagnetically coupled lines in the substrate as a strip line filter.

The substrate has connecting surfaces on opposite sides facing the filters. The layered substrate is otherwise constructed in a known and, for example, the initially described manner. In particular, a delay line or further circuit elements or circuits are embedded in the substrate.

The reception path and/or the transmission path can contain an adaptive network on the antenna side which contains a delay line, which serves the purpose of decoupling the reception path in the frequency range of the transmitter and—with positioning in the receiver path—having a length of $\lambda/4$, for example. The delay line is at least partially located in the multilayer substrate.

In a further embodiment, at least one further discrete element is located on the top of the substrate, which can be selected among a chip element, a transistor, a diode, a resistor, a capacitor or a coil.

The additional discrete element configured as a chip element can also contain a circuit, selected from among an adaptive network, an impedance transducer, a low-pass filter, a MEMS (Micro Electromechanical System) and/or a diplexer.

The additional discrete element can be configured as a semiconductor chip element and can include a power amplifier, a low-noise amplifier or a diode switch.

The invention is described in greater detail in the following based on example embodiments and the corresponding figures. The figures only serve the purpose of illustrating the invention and are therefore only drawn schematically and are not true to scale.

DESCRIPTION OF THE DRAWINGS

Like reference numerals indicate like elements.

DETAILED DESCRIPTION

Figure 1:
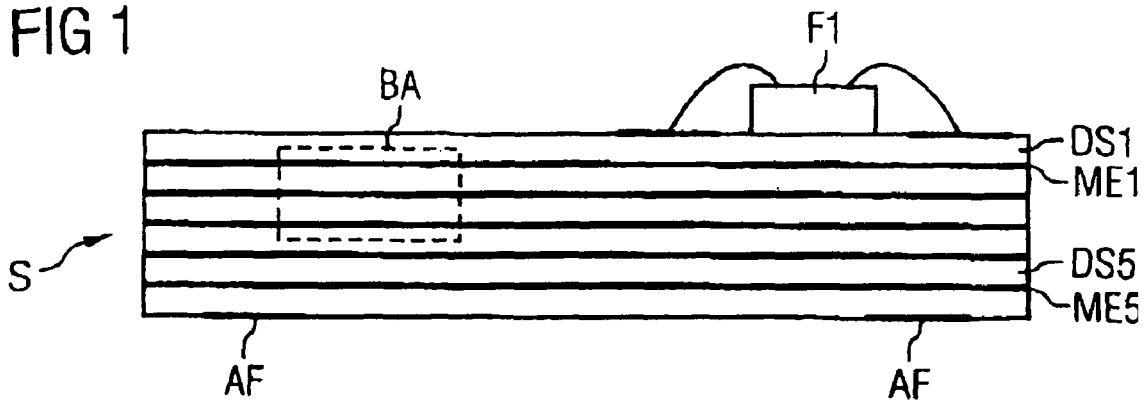
FIGS. 1 to 3 each show a schematic cross section of an RF module in accordance with embodiments of the invention.

FIG. 1 shows a schematic cross section of a first RF module configured as a transmission module. The RF module includes a multilayer substrate S, which has n metallization layers ME1, ME2, . . . MEn, which are located between m dielectric, insulating layers DS1, DS2, . . . DSm. These dielectric layers may include dielectric ceramic. It is thus possible, via appropriate structuring of the metallization layers ME within the module substrate MS, to construct integrated passive elements, in the present example, a balun BA. By structuring the metallization layers, which are not shown in detail, and plated-through holes, which are also not shown, by which electrical connections between the metallization layers are produced, it is possible to construct further circuits within the module substrate and to interconnect the individual components electrically.

A discrete element F1, for example an RF filter, is located on the surface of the substrate S to implement RF functionality. The element F1 is connected with at least one metallization layer and, via plated-through holes and interconnecting elements connected therewith, with the balun BA and the connecting surfaces serving as electrical connectors on the lower surface of the substrate S. The element F1 can be glued onto the module, soldered on using a surface mounted device (SMD) method, or connected to the substrate as a flip chip device. The figure shows an electrical element that is glued on and connected via bond wires.

Figure 2:
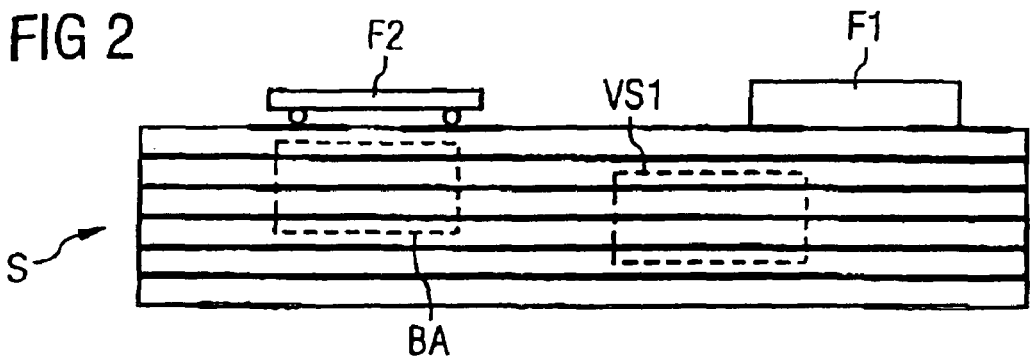

FIG. 2 shows a more highly integrated module. Aside from the balun BA, at least one other interconnection VS1 is integrated in the substrate S. Aside from the first element F1, which is, in this case, for example installed via the SMD method, a second element F2, which is installed via flip chip technology, is located on the surface of the substrate. While the first element is, for example, a chip element and in particular a power amplifier, the second element F2 can be an RF filter, for example a Tx or an Rx filter. First interconnection VS1 can be an adaptive circuit or a low-pass filter integrated in the substrate, which can be used as a transmission filter (Tx filter).

Further circuits can be constructed within the module substrate apart from the components that are shown. Discrete single elements or integrated elements (chips) can be located on the top side of the module substrate and they can be electrically connected with interconnections within the module substrate.

Figure 3:
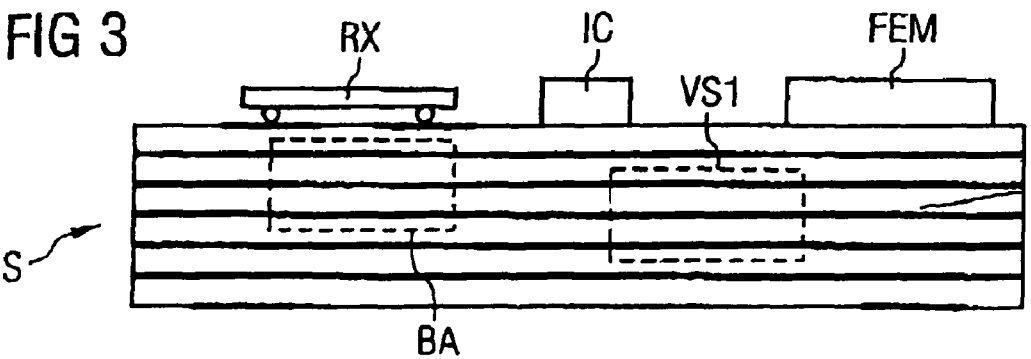

FIG. 3 shows another, more highly integrated embodiment of an RF module in which, aside from the balun BA and a first interconnection VS1 in the substrate, a front-end module FEM, a reception filter Rx and an IC containing chip element IC are located on the substrate and are connected with the electrical connectors of the element.

A switch S configured as an integrated semiconductor element (chip), which enables switching of the transmission module between transmission and reception operation as well as possibly switching between different transmission and reception bands, can be located as a further component on the top side of module substrate. The element constituting the switch S can be applied to the module substrate MS as a flip chip device or by the SMD method as shown. It is also possible to glue the switch S on and to connect it with the transmission module by means of wire bond technology.

The components mentioned as examples can also be present on the module as double and repeated implementations. It is thus possible to provide signal paths for the first transmission path, for the first reception path as well as for other additional transmission and reception paths for other frequency bands or for the frequency bands of different mobile radio systems or mobile radio standards on the module. Individual filters in different paths can then be used in common. This is, for example, possible in the transmission path, since the low-pass filters used there are applicable for different bands for filtering the harmonic waves. Band pass filters may be used for the reception filters (Rx filters) so that different Rx paths can use a filter in common only in case of identical frequency bands.

If the filters are configured "single ended" on both sides, i.e. they have two asymmetric connectors, and a symmetrical signal is needed for further signal processing in the mobile radio terminal device, a balun may be directly connected to the corresponding filter. If the symmetrical signal is only needed at a later stage and an asymmetric signal can be processed in a first processing step, for example in the amplifier, the balun can be built into another section of the respective signal path.

It is also possible to connect components used in common to different paths by means of switches.

Figure 4:
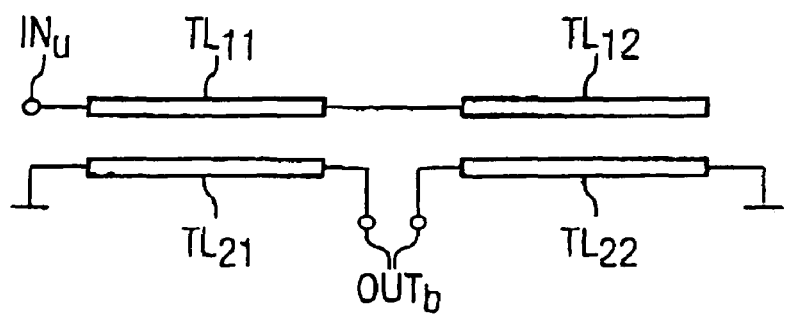
FIG. 4 shows two coupled $\lambda/4$-transformation lines that are used as a balun, which can be integrated into a substrate in accordance with embodiments of the invention.

FIG. 4 shows a balun, which can be integrated into the substrate S. The balun includes a total of 4 line sections, which are a transformation line TL having an electromagnetic length $\lambda/4$, such that two each of the transformation lines are electromagnetically coupled. Two of the transformation lines, TL11 and TL12, are attached or connected in series to the asymmetric input $IN_u$. A transformation line TL21, TL22 connecting a pole of the symmetrical output $OUT_b$ with ground is located spatially in parallel to, but galvanically separate from the transformation lines TL11, TL12, so as to couple with the latter. Through these two coupling lines, an input signal having only a single phase is converted into a symmetrical output signal having a phase shift of 180°.

The transformation lines TL are constructed in the form of bent printed circuits in one of each the metallization layers ME of the substrate S. Each of the transformation lines TL may be located in a separate metallization layer, with the two transformation lines that are coupled with each other being located in neighboring metallization layers. A shielding metallization layer connected to ground may be interposed between the two layers of the first pair of coupling transformation lines and the second pair of coupling transformation lines. The necessary electrical connections are then provided by plated-through holes, which possibly pass through several layers. In this manner, the balun shown in FIG. 4 can be configured in a multilayer substrate with, for example, 5 metallization layers.

In the case of RF modules operating at lower frequencies, the necessary length of the $\lambda/4$ transformation lines TL can be so large that additional module surface would be needed for them, which goes beyond the area requirements of the discrete elements located on the surface of the substrate.

Figure 5:
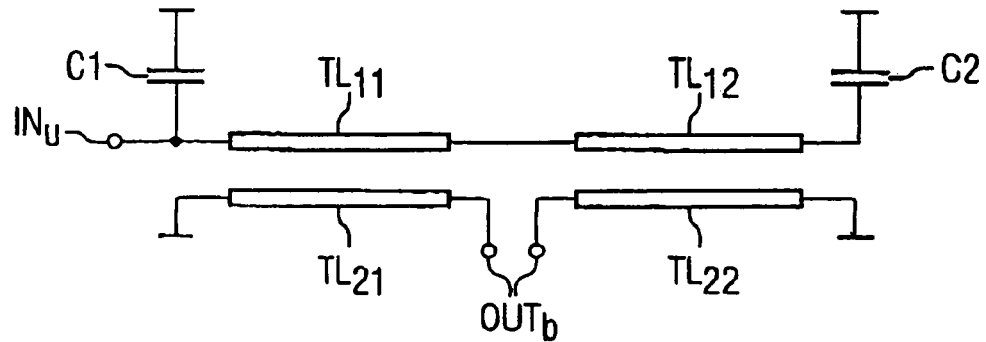
FIG. 5 shows a balun in the form of shortened coupling lines, which can be integrated into a substrate in accordance with embodiments of the invention.

FIG. 5 shows a device with shortened coupling lines, which can have a length of less than $\lambda/4$ due to the shown interconnection. Such shortened coupling lines have a length of for example $\lambda/8$. Apart from the shorter length of the transformation line as compared with the balun shown in FIG. 4, this line differs in that two capacitors C1, C2 connected to ground in parallel are located in the branch connected to the asymmetric input $IN_U$ so that the branching points of the two capacitors that are connected in parallel are located in front of the first and respectively after the second transformation line TL11, TL12. The two line segments connecting to the symmetrical output $OUT_b$ or the transformation lines TL21, TL22 connect the respective pole of the symmetrical output to ground. This circuit can also be constructed in the described manner in different metallization layers within the substrate S. In addition to the balun shown in FIG. 4, this requires two or four layers for the construction of the capacitors C1, C2. These can also be the layers in which the transmission lines are located. Thus, the area requirement is smaller because of the shortened length of the transformation lines compared to the balun shown in FIG. 4.

Figure 6:
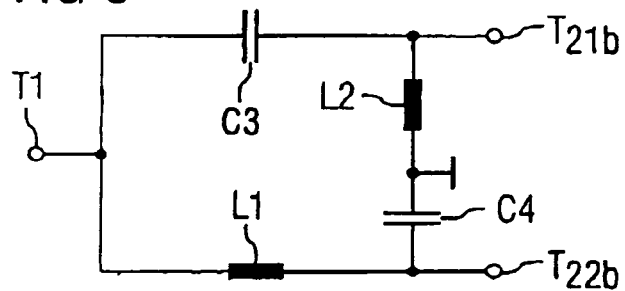
FIG. 6 shows a balun made of LC components, which can be integrated into a substrate in accordance with embodiments of the invention.

FIG. 6 shows a balun constructed of L and C elements, which includes a parallel circuit having an inductance L1 and a capacitance C3. The two parallel branches are connected at the asymmetric input T1 and are individually connected at the output to one pole each T21b, T22b of the symmetrical output. On the output side, the two parallel branches are connected in a bridged manner with an additional parallel branch, in which a capacitor C4 and an inductance L2 are connected in series. In between C4 and L2, this bridging parallel branch is connected to ground.

This balun too can be constructed in a simple manner of structured metallization layers ME separated by dielectric layers DS in a multilayer substrate. While an inductance can be represented by a meandering line section, each capacitance C is constructed in the form of two neighboring but not electrically interconnected conductors. The two conductors can be located in the same or in neighboring metallization layers. In this manner, the balun shown in FIG. 6 can be constructed in a multilayer substrate having at least 2 metallization layers. It is also possible to provide further metallization layers for interconnecting the individual elements, so that the total number of the necessary metallization layers increases accordingly.

An RF module with an integrated balun, as described herein, has the advantage that it can be produced in a simple and integrated manner, that it requires a smaller module surface area in comparison with a module with a discrete balun and that it can be produced more economically and with less processing effort.

Figure 7:
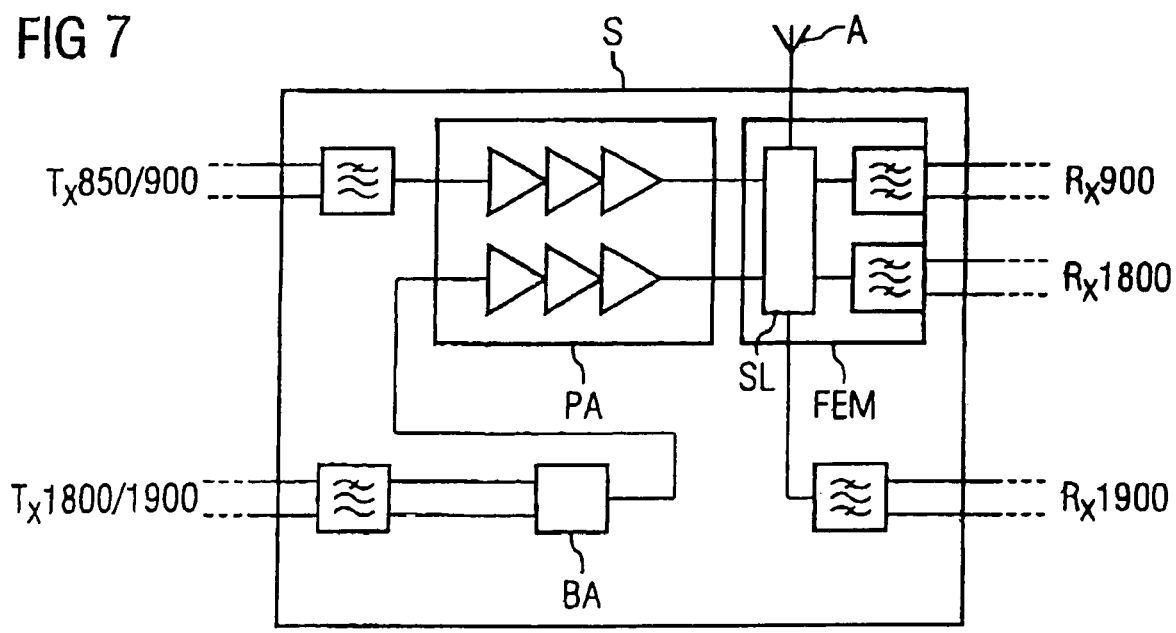
FIG. 7 shows the interconnection of a module of this invention in schematic form.

FIG. 7 shows a circuit diagram for a highly integrated module, which has transmission and reception filters for three different communication bands or systems and in which another power amplifier and the necessary antenna connectors are additionally integrated. The module of FIG. 7 has a further submodule, i.e., a front-end module (FEM), on which two band pass filters, which are for example configured as SAW filters for a first and a second Rx band, are located, for example for Rx900 and Rx1800. The two Rx900 and Rx1800 filters are connected to a switch SL, which alternatively connects the two filters to the antenna connector for the antenna A. A further Rx filter, which is likewise configured as a Rx1900 SAW filter, is located on the substrate as a discrete filter independent of the front-end module and is also connected with the switch S in the front-end module and is thus connectable with the antenna.

A first transmission filter Tx850/900, which is applicable for two frequency bands, and a second transmission filter Tx1800/1900, which is also applicable for two frequency bands, are provided for the transmission branch. While the first transmission filter Tx850/900 has an asymmetric (single ended) output on the antenna side, the second Tx filter Tx1800/1900 is equipped with a balanced (symmetrical) output on the antenna side and requires a balun BA, which is integrated in the substrate S. In this manner, one asymmetric signal each is supplied to the power amplifier PA via two Tx paths and is there amplified to the desired transmission power in, for example, three amplifying stages. The respective Tx path is likewise connected as an asymmetric signal behind the power amplifier PA to the antenna output via the switch SL. The three outputs for the Rx signals at 900, 1800 and 1900 MHz as well as the inputs for the transmission paths are respectively made to be symmetrical and are connected to a corresponding chip element, which is configured as a synthesizer on the transmission side and as a receiver on the receiver side.

Although this invention has been described based on only a few example embodiments, it is not limited to them. Modules with an integrated balun can be constructed with arbitrary combinations of additional components or with another structure without deviating from this invention.

What is claimed is:

1. A radio frequency (RF) module, comprising:
a ceramic multilayer substrate comprising:
dielectric layers; and
metallization layers comprising one or more circuit elements;
the metallization layers being among the dielectric layers;
a symmetric transmission input associated with the ceramic multilayer substrate;
an RF element on the ceramic multilayer substrate to provide RF functionality; and
a balun electrically connected between the symmetric transmission input and the RF element, the balun comprising coupled transformation lines having lengths of less than $\lambda/4$, and the balun being configured to convert the symmetric transmission input having a phase shift of 180° into an unbalanced output signal;
wherein the balun is integrated into the ceramic multilayer substrate, and wherein the metallization layers in the ceramic multilayer substrate are structured to form the balun.

2. The RF module of claim 1, further comprising a transmission filter on a surface of the ceramic multilayer substrate.

3. The RF module of claim 1, further comprising:
a transmission signal path on a metallization layer; and
a transmission output associated with the ceramic multilayer substrate;
the transmission signal path being between the transmission output and the symmetric transmission input.

4. The RF module of claim 3, wherein the balun is integrated in the transmission signal path between the symmetric transmission input and the transmission output.

5. The RF module of claim 1, further comprising a switch on a surface of the ceramic multilayer substrate.

6. The RF module of claim 1, wherein dielectric in the dielectric layers comprises a non-shrinking ceramic.

7. The RF module of claim 1, wherein the RF element comprises a power amplifier for use with a transmission signal path.

8. The RF module of claim 1, further comprising, on a surface of the ceramic multilayer substrate, one or more of a chip element and a surface acoustic wave filter.

9. The RF module of claim 1, further comprising an adaptive circuit integrated into the ceramic multilayer substrate, the adaptive circuit comprising at least one passive component.

10. The RF module of claim 1, further comprising a low pass filter integrated into the ceramic multilayer substrate, the low pass filter comprising at least one of an inductive component, a capacitive component and a strip line resonator.

11. The RF module of claim 1, further comprising a duplexer on a surface of the ceramic multilayer substrate.

12. The RF module of claim 1, further comprising a passive element on a surface of the ceramic multilayer substrate.

13. The RF module of claim 1, further comprising an RF chip element on the ceramic multilayer substrate.

14. A radio frequency (RF) module, comprising:
a ceramic multilayer substrate comprising:
dielectric layers; and
metallization layers comprising one or more circuit elements;
the metallization layers being among the dielectric layers;
a symmetric transmission input having a single phase, the symmetric transmission input being associated with the ceramic multilayer substrate;
an RF element on the ceramic multilayer substrate to provide RF functionality; and
a balun electrically connected between the symmetric transmission input and the RF element, the balun comprising coupled transformation lines having lengths of less than $\lambda/4$, and the balun converting the symmetric transmission input into a symmetrical output signal having a phase shift of 180°; and
wherein the balun is integrated into the multilayer substrate, and wherein the metallization layers in the multilayer substrate are structured to form the balun.

15. The RF module of claim 14, further comprising:
a transmission signal path on a metallization layer; and
a transmission output associated with the ceramic multilayer substrate;
the transmission signal path being between the transmission output and the symmetric transmission input.

16. The RF module of claim 15, wherein the balun is integrated in the transmission signal path between the symmetric transmission input and the transmission output.

17. The RF module of claim 14, further comprising a switch on a surface of the ceramic multilayer substrate.

18. The RF module of claim 14, wherein dielectric in the dielectric layers comprises a non-shrinking ceramic.

19. The RF module of claim 14, further comprising a passive element on a surface of the ceramic multilayer substrate.

20. The RF module of claim 14, further comprising an RF chip element on the ceramic multilayer substrate.

* * * * *